(12) United States Patent
Sakamoto et al.

(10) Patent No.: US 8,062,959 B2
(45) Date of Patent: Nov. 22, 2011

(54) METHOD OF MANUFACTURING SEMICONDUCTOR ELEMENT

(75) Inventors: Keiji Sakamoto, Tokushima (JP); Hiroki Sakata, Tokushima (JP)

(73) Assignee: Nichia Corporation, Anan-Shi (JP)

( * ) Notice: Subject to any disclaimer, the term of this patent is extended or adjusted under 35 U.S.C. 154(b) by 276 days.

(21) Appl. No.: 12/289,767

(22) Filed: Nov. 3, 2008

(65) Prior Publication Data
US 2009/0137098 A1    May 28, 2009

(30) Foreign Application Priority Data

Nov. 4, 2007 (JP) ................. 2007-286830

(51) Int. Cl.
*H01L 21/00* (2006.01)
(52) U.S. Cl. .......... 438/460; 438/462; 438/46; 438/113; 257/E21.499
(58) Field of Classification Search .............. 438/42, 438/46, 113, 460, 462, 463
See application file for complete search history.

(56) References Cited

U.S. PATENT DOCUMENTS

| 7,183,136 | B2 | 2/2007 | Hashimura et al. | |
|---|---|---|---|---|
| 7,397,834 | B2 | 7/2008 | Kozaki et al. | |
| 7,649,923 | B2 * | 1/2010 | Sakamoto et al. | 372/54 |
| 2007/0264802 | A1 | 11/2007 | Sakamoto et al. | |

FOREIGN PATENT DOCUMENTS

| JP | 9-232676 | A | 2/1996 |
|---|---|---|---|
| JP | 3395631 | B2 | 1/1999 |
| JP | 3449201 | B2 | 6/1999 |
| JP | 11-177137 | A | 7/1999 |
| JP | 2000-058972 | A | 2/2000 |
| JP | 3727187 | B2 | 3/2000 |
| JP | 2004-031526 | A | 1/2004 |
| JP | 2004-165226 | A | 6/2004 |
| JP | 2004-165227 | A | 6/2004 |
| JP | 2004-228290 | A | 8/2004 |
| JP | 2004-259846 | A | 9/2004 |
| JP | 2004-327879 | A | 11/2004 |
| JP | 2005-159278 | A | 6/2005 |
| JP | 2006-165407 | A | 6/2006 |
| JP | 2007-329459 | A | 12/2007 |

* cited by examiner

*Primary Examiner* — Jack Chen
(74) *Attorney, Agent, or Firm* — Birch, Stewart, Kolasch & Birch, LLP

(57) ABSTRACT

A step of forming a first auxiliary groove in a semiconductor element structure provided on a semiconductor substrate, a step of forming a second auxiliary groove in the semiconductor element structure, and a step of dividing the semiconductor substrate and the semiconductor element structure in a direction along the first auxiliary groove and the second auxiliary groove are provided, and in the dividing direction, a plurality of the second auxiliary grooves are arranged spaced apart from each other, and at least two first auxiliary grooves are arranged spaced apart from each other between at least a pair of adjacent second auxiliary grooves, and in the dividing step, a separation region interposed between the two first auxiliary grooves is divided, so as to improve such accuracy and suppress the problems such as a damage of the end surface due to cleavage of the substrate.

20 Claims, 5 Drawing Sheets

METHOD OF MANUFACTURING SEMICONDUCTOR ELEMENT

BACKGROUND OF THE INVENTION

1. Field of the Invention

The present invention relates to a method of manufacturing a semiconductor element, and particularly to a method of manufacturing a nitride semiconductor laser element.

2. Discussion of the Related Art

A nitride semiconductor is formed by a compound semiconductor of $In_xAl_yGa_{1-x-y}N$ ($0 \leq x$, $0 \leq y$, and $0 \leq x+y \leq 1$), various demands for the semiconductor laser elements using such a nitride semiconductor have been increasing, for use in optical disc systems capable of recording and reproducing large-volume, high-density information such as a next-generation DVD, and for use in electric appliances such as personal computers. For this, many studies have been conducted to manufacture the semiconductor laser elements using such a nitride semiconductor with a good reproducibility while maintaining their stable properties.

For example, in order to prevent chipping and cracking of the ridge due to propagation from a dislocation-concentrated region upon forming a resonator surface by cleavage so as to reduce damage to a nitride semiconductor laser element and to stabilize a current-voltage characteristics of the element, there has been proposed is a method of forming grooves which extend in the resonator direction of the laser element and cut from an upper surface of nitride semiconductor growth layers into an interface of a p-n junction, as described in JP 2004-327879A.

However, even if cleavage is performed by using such grooves (as in JP 2004-327879A), cleaved planes may deviate from the intended locations due to dislocation density and crystal defects and the like within the substrate or nitride semiconductor layers, making it difficult to achieve a stable product yield In the cases where partial grooves in a shape of dotted line, cross, and the like, are formed on the intended dividing lines by laser processing as described in JP2004-165226A, JP2004-165227A, and JP2004-259046A, a high precision is not required, because a wider width is allowed to the predetermined cleavage lines by using the surrounding area of an LED as a margin for cutting. On the other hand, this method cannot be applied to a high-precision dividing. In the cases where the predetermined cleavage lines are formed by typical scribing or by laser processing, cleavage locations may be contaminated, damaged, or deformed by scribing. Also, because of their large processing width and low precision, stable dividing with a repeatable degree of high precision cannot be obtained, so that such scribing is not applicable to divide the element regions.

In semiconductor laser elements, typically, a two-step dividing process is employed, in which a wafer is divided into bar-shaped pieces (hereinafter may be described as primary cleavage) and then a bar-shape semiconductor element is divided into chip-shaped pieces (hereinafter may be described as secondary cleavage). Thus, a resonator surface is formed by cleaving into bar-shape and an end-surface protective film is disposed on the resonator surface. That is, laser beam is emitted from the resonator surface formed by the primary cleavage. Therefore, high accuracy, in other word, a smooth resonator end surface is required to be formed in the primary cleavage.

There has been a method of dividing, in which cleaving property of the semiconductor substrate used to form a semiconductor element structure is used for dividing. However, cleavage may depend on the crystallinity of the substrate and it may cause difficulty in control of cleavage. For example, in a nitride semiconductor substrate whose substrate crystal is formed by growths of different in-plane crystal orientations, such as by ELO growth, controlling of cleavage becomes significantly difficult.

SUMMARY OF THE INVENTION

The present invention includes the structure described below.

A method of manufacturing a semiconductor element includes a step of forming a first assist-groove in a semiconductor element structure provided on a semiconductor substrate, a step of forming a second assist-groove in the semiconductor element structure, and a step of dividing the semiconductor substrate and the semiconductor element structure in directions along the first auxiliary groove and second auxiliary groove. In the dividing directions, a plurality of second auxiliary grooves are arranged apart from each other and at least two first auxiliary grooves, which are apart from each other, are arranged between at least a pair of adjacent second auxiliary grooves, and in the dividing step, dividing is conducted at a separation region between the two first auxiliary grooves.

The second auxiliary grooves are deeper than the first auxiliary grooves.

The first auxiliary grooves are cut into the element structure and the second auxiliary grooves are cut to or into the substrate.

In the dividing direction, the length of the second auxiliary grooves is longer than that of the first auxiliary grooves adjacent to the second auxiliary grooves.

The second auxiliary grooves are wider than the first auxiliary grooves.

A pair of adjacent auxiliary grooves are connected to the first auxiliary grooves arranged to interpose a separation region.

In the dividing direction, a plurality of auxiliary groove units, each of which is composed of a second auxiliary groove and a first auxiliary groove continuous to both ends of the second auxiliary groove, are arranged spaced apart each other in the separation area.

The second auxiliary grooves are formed by laser processing.

In the step of forming the second auxiliary grooves, the second auxiliary grooves are formed over the first auxiliary grooves so that the length of the second auxiliary grooves is shorter than that of the first auxiliary grooves.

The semiconductor element structure is a laser element structure in which at least a first conductive-type semiconductor layer, an active layer, and a second conductive-type semiconductor layer are stacked in sequence on the semiconductor substrate.

The first auxiliary grooves are provided so as to expose a part of the first conductive type semiconductor layer from the second conductive type semiconductor layer side, and the second auxiliary grooves are provided so as to expose a part of the semiconductor substrate from the second conductive type semiconductor layer side.

The second auxiliary grooves are longer and wider than the first auxiliary grooves and a pair of adjacent second auxiliary grooves are continuous to the first auxiliary grooves that interpose a separation region.

The first auxiliary grooves are formed by dry etching and the second auxiliary grooves are formed by laser processing.

In the dividing process, a resonator surface of laser element structure is formed in the separation region.

The semiconductor element structure is a nitride semiconductor laser element structure and the semiconductor substrate is a GaN substrate.

A method of manufacturing a semiconductor element includes a step of forming a plurality of first auxiliary grooves arranged apart from each other in a semiconductor element structure on a semiconductor substrate, a step of forming a second auxiliary groove over each of a pair of adjacent first auxiliary grooves so that the first auxiliary grooves are continuous to both ends of each of the second auxiliary grooves respectively, and a step of dividing the semiconductor substrate and the semiconductor element structure in the dividing direction along the first auxiliary grooves and the second auxiliary grooves. In the dividing step, dividing is conducted in the separation region interposed between the adjacent first auxiliary grooves continuous to respective second auxiliary groove to obtain individual semiconductor element.

A method of manufacturing a semiconductor element includes a step of forming a first auxiliary groove in a semiconductor element structure provided on a semiconductor substrate, a step of forming a second auxiliary groove in the semiconductor element structure, and a step of dividing the semiconductor substrate and the semiconductor element structure in directions along the first auxiliary groove and second auxiliary groove. In the dividing directions, a plurality of second auxiliary grooves are arranged apart from each other and at least two first auxiliary grooves, which are apart from each other, are arranged between at least a pair of adjacent second auxiliary grooves, and in the dividing step, dividing is conducted at a separation region between the two first auxiliary grooves.

According to a method of manufacturing a semiconductor element of the present invention, two kinds of cleavage auxiliary grooves are adjacently provided along a proposed cleavage location so that cleavage location can be controlled and a substrate and a semiconductor stacked structure can be divided at a desired position with high accuracy, and product yield can be improved.

DETAILED DESCRIPTION OF THE PREFERABLE EMBODIMENTS

Figure 1A:
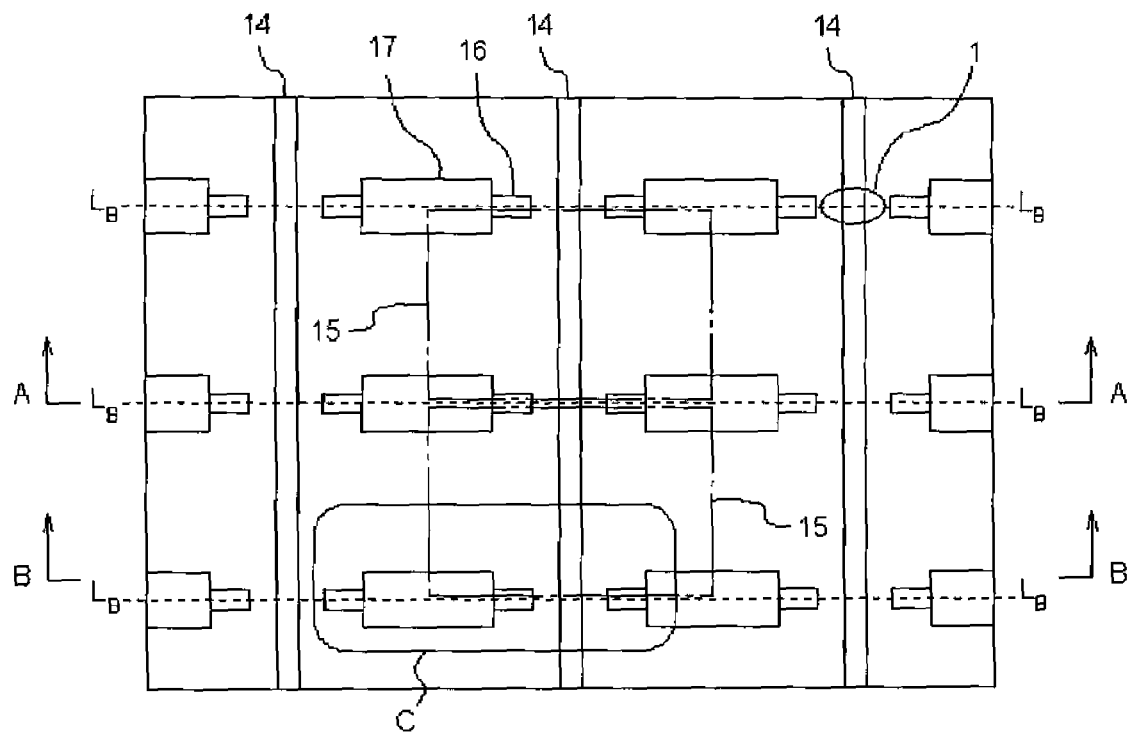
FIG. 1A is a schematic plan view illustrating an embodiment of the present invention.

An embodiment of a method of manufacturing a semiconductor element according to the present invention is described below with reference to FIG. 1. FIG. 1 illustrates an example of forming a resonator end surface of a laser element, where a substrate and a semiconductor element structure are divided at dividing positions $L_B$ which are substantially perpendicular to a ridge 14 of resonator direction. FIG. 1A schematically shows a part of the upper surface of a semiconductor wafer, and FIG. 1B and FIG. 1C schematically show sectional views taken along section lines A-A and B-B of FIG. 1A respectively.

Figure 1B:
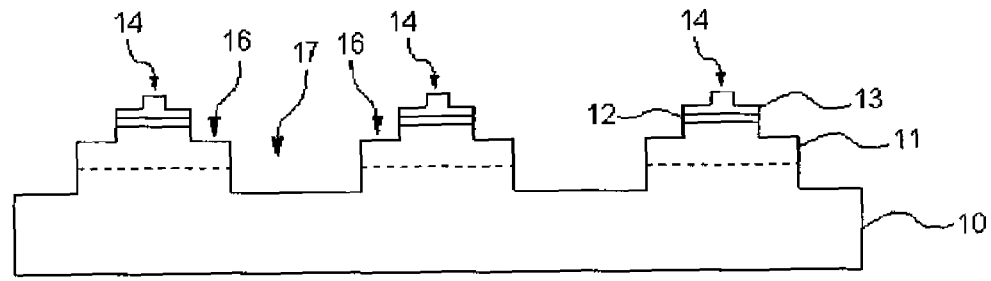
FIG. 1B is a schematic cross-sectional view taken along line A-A of FIG. 1A.
Figure 1C:
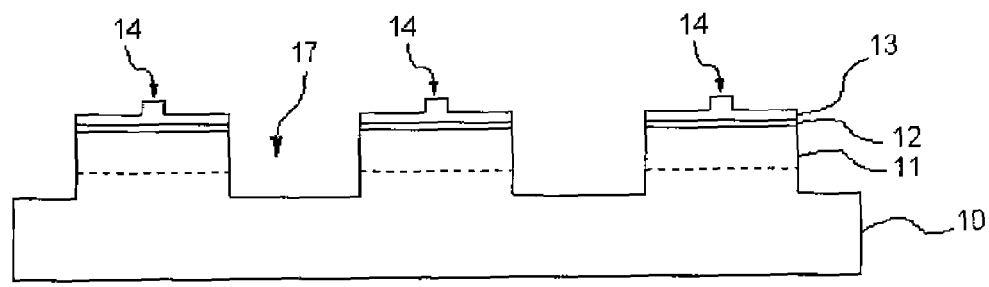
FIG. 1C is a schematic cross-sectional view taken along line B-B of FIG. 1A.

As shown in FIG. 1, in the present embodiment, a plurality of the first auxiliary grooves and second auxiliary grooves are provided apart from each other, in the dividing directions $L_B$ of the wafer and over the intended dividing lines $L_B$. Thus, at least two kinds of auxiliary grooves are arranged in the dividing direction and dividing is carried out along the auxiliary grooves. Particularly, in the case of a laser element, the region 1 for the resonator end surface is provided in the area interposed between the adjacent first auxiliary grooves, and cleaved end surfaces are formed in the region by dividing along the auxiliary grooves. Thus, according to the present invention, desired cleaved end surfaces can be formed in the dividing region 1 locating separated from the auxiliary grooves with high precision. In the example shown in the figures, the first auxiliary grooves are shallower and the second auxiliary grooves are deeper (FIGS. 1B, 1C), and the second auxiliary grooves are longer in the dividing direction than the first auxiliary grooves, and further, the second auxiliary grooves are wider than the first auxiliary grooves in substantially perpendicular direction to the dividing direction. The length, width, and the depth of each type of the grooves will also be described below.

The present invention overcomes the difficulty of cleavage with high accuracy using only a single kind of auxiliary grooves. Described below is an example shown in FIG. 2A, in which only the second auxiliary grooves 17 of embodiment shown in FIG. 1 are provided in a shape of dotted line over the intended dividing lines $L_B$. In this example, the auxiliary grooves have a wide width (in the width direction of dividing line) with respect to the dividing lines. Therefore, even if the deviation of the actual dividing direction or cleaving direction shown by dashed lines b-b from the alignment direction of the auxiliary grooves 17 is rather large, the degree of deviation can be confined within the groove. On the other hand, because of the wide grooves, controlling of the direction of dividing or cleaving in the grooves becomes difficult.

Figure 2A:
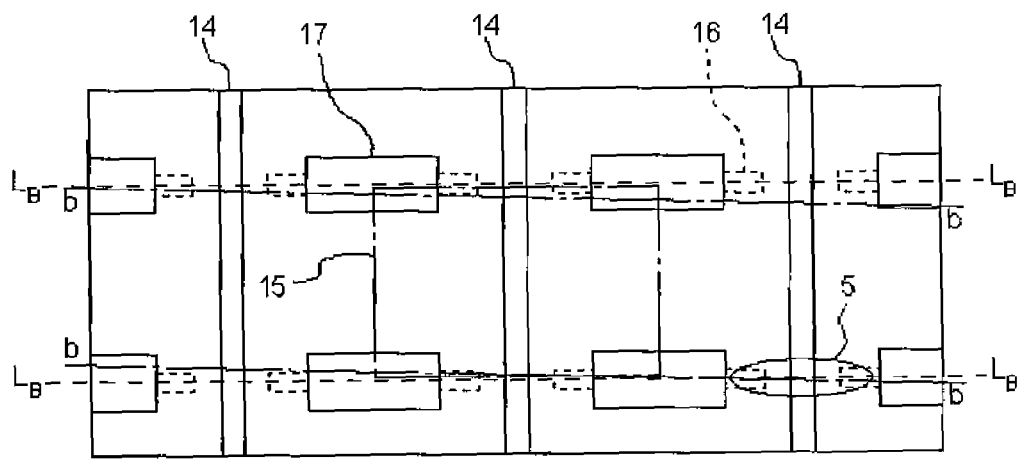
FIG. 2A is a schematic plan view illustrating second assist grooves according to an embodiment of the present invention.
Figure 2B:
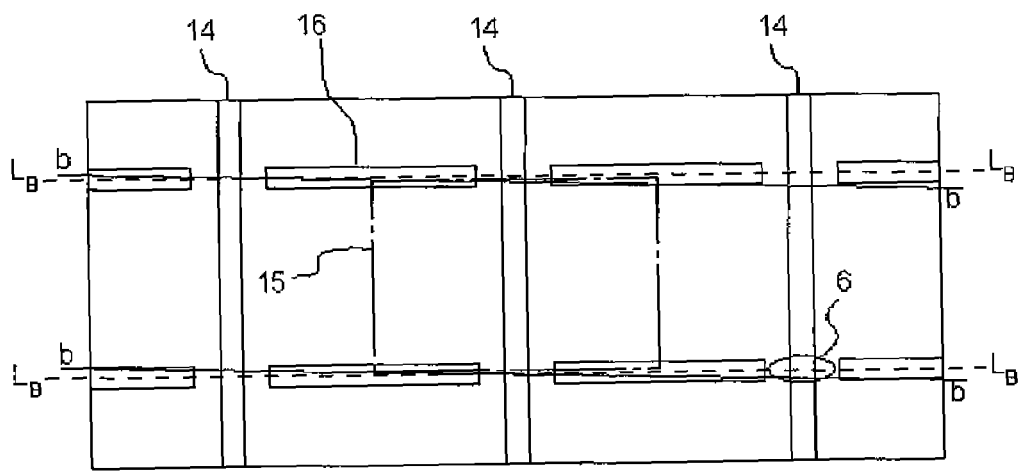
FIG. 2B is a schematic plan view illustrating first assist grooves according to an embodiment of the present invention.

In another example having a structure where only the first auxiliary grooves 16 shown in FIG. 2B of the present embodiment are provided in dotted lines over the intended dividing lines $L_B$, the grooves have a narrower width. Therefore, even if the angular deviation or dimensional deviation of actual dividing direction or cleaving direction from the above-described dividing line $L_B$ is minute, actual dividing may deviate into a region outside of the grooves where the deviation is difficult to be adjusted.

That is, a wider width of the second auxiliary grooves allows accommodating greater degree of deviation of directions and positions, and a narrower width of the first auxiliary grooves than that of the second auxiliary grooves allows the deviation adjusted in the second auxiliary grooves to be introduced in a range adjustable in the first auxiliary grooves and thus enables finer adjustment of the directions, positions of dividing or cleaving than obtained by using the second auxiliary grooves. Therefore, as shown in FIGS. 1, 2C, 3, and 4, in order to effectively combine the functions of the first and second auxiliary grooves to realize dividing with high accuracy, dividing regions 1 to 3 are provided in the separation region of adjacent first auxiliary grooves 16B, 16C (30B, 30C). In addition, as shown in the figures, the second auxiliary grooves 17 (31), provided adjacent to the first auxiliary grooves with which the dividing regions are interposed, allow broad adjustment of dividing or cleaving. Preferably, two first auxiliary grooves interposing the dividing region are provided between the adjacent second auxiliary grooves.

In the example shown in FIG. 1, as shown in the cross sectional views (FIGS. 1B and 1C), the depth of the grooves are shallower in the first auxiliary grooves 16 and deeper in the second auxiliary grooves 17. The second auxiliary grooves 17 are deep, so that, as shown in FIG. 2A, inclination in cleavage direction, and deviation of cleavage position from the intended dividing lines $L_B$ can be more readily guided into the grooves. Thus, dividing or cleavage direction, and positions can be adjusted within the grooves. On the other hand, provision of the deep grooves are in turn exposure of deeper region with respect to the semiconductor element structure. Therefore, the element structure is under larger restriction, there are difficulties that the element structure is greatly influenced by roughness of the processed end surface and the like. On the other hand, such difficulties will be reduced with the shallower first auxiliary grooves, but as shown in FIG. 2B, the above-described guiding effect, that is, the effect of auxiliary grooves will also be reduced. In addition, in consideration of the wafer containing semiconductor substrate and the semiconductor element structure thereon, at the element structure and substrate region which are directly adjacent to the second auxiliary grooves, difference between the thickness of these regions and the remaining thickness of the wafer at such grooves is large as shown in FIG. 1C. Therefore, impact caused by dividing or cleaving is large, so that roughness or chipping of the surface easily occurs. On the other hand, as shown in FIG. 1B, the difference between the remaining thickness of the wafer at the first auxiliary grooves and the thickness of its adjacent regions is small, so that the above-described problems can also be suppressed. In a different perspective, the difference between the remaining thickness of the wafer at such grooves and the thickness of the element structure (substrate) regions adjacent the grooves differs at the first auxiliary grooves and the second auxiliary grooves. Therefore, the direction or position of the dividing or cleaving of the wafer can be directed from the second auxiliary grooves to the first auxiliary grooves. Specifically, dividing or cleaving from the deeper second auxiliary grooves tends to be directed to the shallower first auxiliary grooves (FIG. 1B) than to the adjacent regions (FIG. 1C) of the element structure and substrate where the difference of the thickness is large as shown in FIGS. 1B and 1C. Therefore, using the tendency, that is, arranging the first auxiliary grooves near the second auxiliary grooves, and preferably, connecting the grooves, preferable guiding effect can be obtained. Thus, as shown in FIGS. 1A to 1C, provision of the first auxiliary grooves to interpose the dividing region, and of the second auxiliary grooves at each of the external sides of the first auxiliary grooves respectively, enables a preferable dividing.

Figure 4:
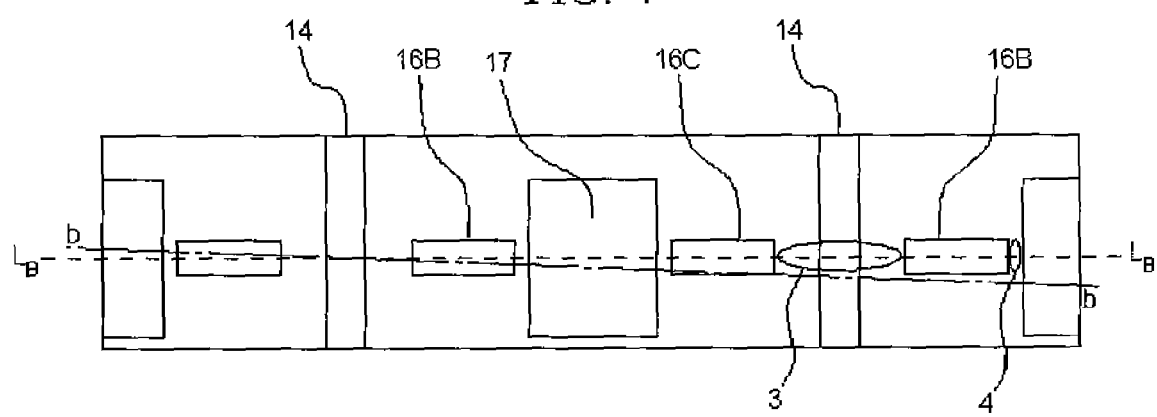
FIG. 4 is a schematic plan view illustrating an embodiment of the present invention.

The expression "arranging near" as used in the specification includes configurations other than the configuration in which the first and second auxiliary grooves are connected each other as shown in FIGS. 1A to 1C. In a case where adjacent first and second auxiliary grooves are arranged spaced apart each other, as shown in FIG. 4, the distance in the aligning direction between adjacent grooves is set such that the first and the second auxiliary grooves are spaced apart with a distance (separation region 4) shorter than the distance between adjacent first auxiliary grooves or the distance between adjacent second auxiliary grooves, whichever is greater, preferably shorter than the both, more preferably shorter than the dividing region 1.

In consideration of formation of a particular cleaved surface in the element structure, specifically, formation of a resonator end surface of the laser element, it is preferable to arrange the first auxiliary grooves between the dividing region 1 and the second auxiliary grooves so that the first auxiliary grooves and the second auxiliary grooves are arranged in this order from the dividing region 1. The resonator end surface of the laser element is provided as a corresponding end surface in the core region in the stacked layer direction of the element structure and in the particular resonator region such as a ridge in horizontal direction. Therefore, the depth of the grooves is made shallower toward the dividing region by the arrangement of each of the grooves as described above. Specifically, the resonator end surface is formed in the semiconductor element structure, and the first auxiliary grooves deeper than the resonator end surface and the second auxiliary grooves deeper than the first auxiliary grooves are sequentially arranged with respect to the resonator end surface of the dividing region 1. Accordingly, the depth of the grooves is made shallower and the remaining thickness of the wafer is made thicker from the second auxiliary grooves toward the dividing region 1. Thus, the top surface of the divided surface of the wafer (the bottom surface of the grooves) is closer to the surface of the wafer to which the resonator end surface be provided, so that a preferable divided surface, in which roughness or chipping of the surface due to the above-described impact is suppressed, can be formed.

Thus, it is preferable that the first auxiliary grooves which are shallower and narrower and the second auxiliary grooves which are deeper and wider are arranged as described above, with respect to the dividing region. In addition, the grooves may be formed to satisfy either the width or the depth described above.

In addition, as described above, the first auxiliary grooves and the second auxiliary grooves are respectively arranged with different distances due to the functions thereof. Specifically, the second auxiliary grooves are formed deeper or wider than the first auxiliary grooves. Therefore, as described above, the distance between the second auxiliary grooves can be wider than that of the first auxiliary grooves due to the functions thereof. Similarly, the first and second auxiliary grooves may have different length in the dividing direction. Specifically, the first auxiliary grooves are preferably formed longer so as to accommodate the function as shown in FIG. 2B or as described above. Specifically, as shown in FIGS. 1A to 1C, and FIGS. 3A and 3B and the like, it is preferable to set the distance between the ends of the first auxiliary grooves 16B, 16C (30B, 30C) connected each other via a second auxiliary groove and the remaining portion 16A (30A) to be longer than the second auxiliary grooves. It is further preferable to set the total length of the grooves be longer than the length of the second auxiliary groove. On the other hand, the distance between the second auxiliary grooves are set wider, so that the length of individual second auxiliary groove is preferably longer than the first auxiliary groove in functional view.

A plurality of the first auxiliary grooves are arranged spaced apart from each other, specifically, arranged along the intended dividing line LB. The second auxiliary grooves are also arranged similarly. In addition, as shown in FIG. 1A, a plurality of the intended dividing lines $L_B$ may be provided in a wafer at a desired interval and number. In the examples shown in FIG. 1A, the intended dividing lines $L_B$ in single direction are shown, but the intended dividing lines $L_B$ may be provided in two directions such as in a reticular pattern or in multiple directions. For example, the intended dividing lines may be provided in two directions as shown in FIG. 1A in a direction along the alternate long and short dash lines $L_B$ and the direction approximately perpendicular thereto, so as to demarcate the element region 15 shown in FIG. 1A. In a case in which the intended dividing lines are provided in multiple directions, the grooves of each direction may be overlapped or separated, but in order to enhance the precision of dividing, at least first auxiliary grooves are separated, preferably, the first and the second auxiliary grooves are arranged apart from each other to enhance the function of one another. For example, in the example shown in FIG. 1A, the alignment of each kind of groove in a direction perpendicular to the direction of $L_B$ is such that the first and second grooves are arranged in perpendicular direction with respect to the direction of $L_B$ and in the portion between the alignment of the first and second auxiliary grooves arranged in the direction of $L_B$ and spaced apart from them.

In the examples shown in FIGS. 1A to 1C, 2C, 3A, 3B, and 4, a first auxiliary groove is arranged at each longitudinal end of each second auxiliary groove, or two first auxiliary grooves are provided with respect to each second auxiliary groove. Provision of such configurations as described above, that is, arranging the first auxiliary grooves so as to interpose the dividing region 13 and arranging the second auxiliary grooves adjacent to the first auxiliary grooves, is to improve the dividing precision. The configuration is not limited thereto but may be such that the first auxiliary grooves are arranged only a side of the second auxiliary grooves, or that a first auxiliary groove is provided with respect to a second auxiliary groove. In such cases, each dividing region is interposed between the first and second auxiliary grooves. Therefore, as described above, dividing with high precision can be made in the region near the first auxiliary grooves, but the dividing precision decreases in the region near the second auxiliary grooves and occurrence of damage in the cleaved surface increases. Further, the first and second auxiliary grooves may be arranged such that either one of the two kinds of grooves are formed in the proportion of 1 to 3 or more (1-to-3) or n-to-m (in which $n \neq m$, n and m are positive integers), or the same number of the two kinds of grooves are arranged alternately, that is, in the proportion of n-to-n (in which, $n>1$, n is positive integer). As described above, except the arrangement at the proportion of 1 (second auxiliary grooves) to 2 (first auxiliary grooves), when a plurality of one kind of grooves are arranged between adjacent grooves of the other kind, the above-described function of each kind of the grooves, particularly, the function of one of the two kinds of grooves tends to decrease, however, according to the element structure, dividing with a desired precision, roughness of the end surface, and degree of damage becomes possible.

The nitride semiconductor substrates used in the preferred embodiments and in the examples of the invention to be hereinafter described, are formed by various methods, and the crystallinity and the cleaving property of the substrate may vary according to the method that is used. Particularly, variation in the crystallinity and the cleaving property becomes significant in the substrates formed by growing by way of a lateral growth such as ELO method and then formed into a unit, or the substrates formed by such way and having high-dislocation regions distributed in the surface of the substrate. In such substrates, high precision dividing tends to be difficult to obtain. However, by using the dividing methods according to the present invention, dividing of the substrate with high precision and obtaining flat cleaved surfaces can be realized in such substrates. The present invention can be applied not only to the semiconductor substrates but also to crystalline substrates in which crystallinity and cleaving properties are of importance.

Figure 2C:
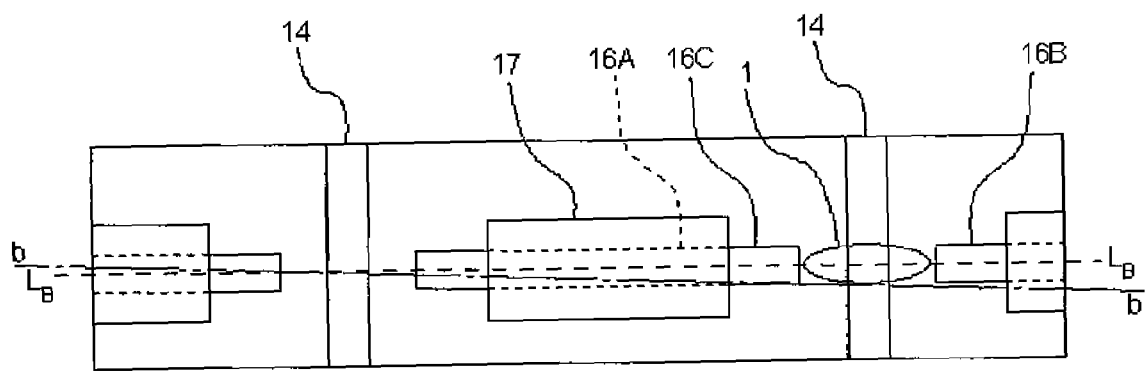
FIG. 2C is a schematic plan view illustrating first and second assist grooves according to an embodiment of the present invention.

FIGS. 2A to 2C are schematic plan views illustrating positional relationship between the direction or location (b-b lines in the figures) of dividing or cleaving of a substrate and the intended dividing lines $L_B$, where the deviation of cleaving from the intended dividing lines $L_B$ in the substrate, in which crystallinity and cleavage properties may be a problem, are illustrated.

As described above, the first and second auxiliary grooves provide respective functions according to the shape, width, and depth of the grooves. With such functions, particularly, when the second auxiliary grooves are deep or wide, preferably the both, effective adjustment of cleavage deviation in the substrate having difficulty due to its crystallinity and cleavage properties, that is, having a large deviation from the intended dividing lines $L_B$. For example, in a case where the intended dividing line extends across the dislocation-concentrated region or high-density dislocation region and the like in the embodiments and examples of the laser element to be hereinafter described, direction of dividing or location of dividing tends to shift at the dislocation-concentrated region and the change in the deviation tendency in dividing likely to occur. Providing the second auxiliary grooves enables suppressing the deviation in cleaving in the region or providing grooves that separate the region enables suppressing the deviation. Specifically, the second auxiliary grooves may be provided along the dislocation-concentrated region, or provided so as to partially overlap with the dislocation-concentrated region, so that effect to the dividing deviation in the region can be suppressed. The second auxiliary grooves may be provided to overlap with more than a half of the region, preferably to overlap with the entire region, further preferably to divide the region, so that the width of the dividing that crosses the region and the effect thereof can be reduced. The effect of dislocation-concentrated region or high-density dislocation region can also be suppressed by providing the first auxiliary grooves adjacent to the region or over the region, however, the functional capability of the first auxiliary grooves is smaller than that of the second auxiliary grooves. Therefore, it is preferable to provide the first auxiliary grooves in combination with the second auxiliary grooves. For example, it is preferable to provide sets of the first auxiliary grooves and the second auxiliary grooves connected with each other so as to overlap with a part or entire high-density dislocation region or the like. It is more preferable to provide the second auxiliary grooves across the region and the first auxiliary grooves connected to the second auxiliary grooves, and with this configuration, the effect of each auxiliary groove cam be maximized.

Now considered is a substrate which does not have regions of clearly different crystallinity but has the same problems as described above. Examples of such substrates include, a crystal substrate obtained by HVPE growth including two-step growth of domain growth or rate-controlled growth and has low crystallinity or has fluctuation of crystal planar orientation and/or axis orientation within the substrate surface. Each kind of auxiliary groove, particularly the second auxiliary grooves can be functioned to solve such problems in the substrates having unspecified or uncertain distribution of crystallinity. For example, FIG. 2 shows deviations in dividing or deviations in dividing direction and location bb from the intended lines $L_B$. With each type of the grooves, particularly with wide or deep, preferably wide and deep second auxiliary grooves, the direction of dividing can be changed or the location of dividing can be shifted in the groove region as in the dislocation-concentrated region or high-density dislocation region described above. This is because the dividing can be drawn into the auxiliary grooves as described above, and the direction and location can be adjusted along the direction of the grooves. Therefore, even if the dividing direction or dividing location shown by the lines bb deviates from the intended dividing lines $L_B$, the deviation can be contained within the grooves and the direction or location of dividing can be directed along the intended dividing lines $L_B$. At this time, dividing bb can be suitably contained within the wide grooves, and the direction and location of dividing can be adjusted more effectively with the deep grooves. Therefore, provision of the second auxiliary grooves rather than the first auxiliary grooves is more suitable, and further, it is preferable to provide wider or deeper, preferably wider and deeper second auxiliary grooves. The first auxiliary grooves are preferably employed in combination with the second auxiliary grooves as in the cases of dislocation-concentrated region described above.

In addition, in FIG. 4, the longitudinal direction of the second auxiliary grooves is different than the direction of the intended dividing line $L_B$, that is, to the direction approximately perpendicular to the intended dividing line $L_B$. The configuration is preferable in view of function which is similar to that of the dislocation-concentrated region, that is, in a case where the function is priority rather than the auxiliary dividing in the direction of the intended dividing line $L_B$.

A plurality of first auxiliary grooves 16 are formed in a dashed-line-pattern at the intended dividing location bb of the semiconductor element. Particularly, in a case of a semiconductor laser element as shown in FIGS. 1 and 3, it is preferable to form the first auxiliary grooves so as to interpose the ridge 14 forming the optical waveguide. In addition, as shown in the figure, it is preferable to form a part of the first auxiliary grooves 16 so as to overlap with the second auxiliary grooves 17, but the configuration is not limited thereto and the first and second auxiliary grooves may be formed spaced apart from each other, as shown in FIG. 4.

In an example of the laser element to be hereinafter described, the first auxiliary grooves 16 are formed with such a depth as to expose at least the first conductive type semiconductor layer 11, by removing at least the second conductive type semiconductor layer 13 and the active layer 12 from the second conductive type semiconductor layer 13 side. In addition, when needed, the first auxiliary grooves may be formed by removing the first conductive type semiconductor layer 11, and further removing a part of the semiconductor substrate 10. Specifically, the depth of the first auxiliary grooves may be such that approximately the same depth as the exposed region 29 or a depth exposing the semiconductor substrate 10. As described above, the first auxiliary grooves are preferably provided with a depth located within the semiconductor element structure on the substrate, or a depth located within the semiconductor element structure near the interface with the substrate. Such arrangement is advantageous to form a smooth end surface in the element structure with high precision. For example, in a laser element, the function of the first auxiliary groove can be maximized with the depth deeper than the core region of the semiconductor layered body where a suitable end surface with respect to the core region can be formed, preferably near the core region, that is, with the depth located within the first conductive type layer and deeper than the core region thereof.

The width of the first auxiliary grooves 16 (the length approximately perpendicular to the dividing direction bb) is not specifically limited and the width thereof may be about 1 to 5 μm. The length (dividing direction bb) is not specifically limited and it may be about 3 to 10 μm.

The second auxiliary grooves 17 are preferably made wider than the first auxiliary grooves 16. With this arrangement, as described above, the direction of dividing or cleavage can be suitably directed, so that the positional deviation can be prevented. In a specific example, the width is in a range of about 5 to 15 μm (that is, a length approximately perpendicular to the dividing direction bb). The length (dividing direction bb) is not specifically limited and it may be about 20 to 80 μm. In addition, as described above, a part of the second auxiliary grooves 17 are preferably formed to overlap the first auxiliary grooves 16.

The second auxiliary grooves 17 are preferably formed deeper than the first auxiliary grooves 16. In an example of laser element to be explained in the following, the first auxiliary grooves 16 are preferably formed from the second conductive type semiconductor layer 13 side to a depth at least reaching the semiconductor substrate 10. This is because if the grooves have a depth reaching the substrate, the controlling of cleavage and dividing can be improved in the substrate having problems in its crystallinity and cleavage. In a specific example, the depth from the second conductive semiconductor layer 13, that is, the depth from the surface of the element structure is in a range of about 3 to 50 μm, or further, in a range of about 5 to 40 μm.

In addition, if the second auxiliary grooves are formed by laser processing as described in the following, the dividing property and cleavage property of the grooves tend to be improved. In a specific example, as shown in Example 2, dividing can be conducted in a range of 3 to 80 μm, preferably in a range of 3 to 50 μm, further preferably in a range of 5 to 40 μm. In a shallow depth in the above-described range, for example a depth of 3 μm, the depth is similar to or smaller than the thickness of the semiconductor element structure on the substrate, however, dividing can be conducted in such a case.

The size of each groove is determined from the examples hereinafter provided, but the size thereof is not limited thereto, the size can be determined suitably taking into account the functions of each grooves of the present invention with respect to various elements and substrates.

The shape of each grooves are not specifically limited, and various shapes such as a pointed shape and a polygonal shape in plan view, that is, a rectangular, square, circular, oval, or triangular shape can be employed. As shown in FIGS. 1 and 3 for example, a shape having longitudinal sides in the direction of the intended dividing lines LB, such as a rectangular shape, a long ellipse shape, a track shape, and a pointed shape is preferable. Cross-sectional view of the grooves is not specifically limited, but for example, as shown in FIGS. 1 and 3, a rectangular shape and a trapezoidal shape are preferable. Also, a polygonal shape and a circular shape can be employed.

Method of forming each groove is not specifically limited, and for example, an etching technique such as wet etching or dry etching, a mechanical processing using a dicer or a scriber, or a laser processing can be used. As shown in examples below, it is preferable that the first auxiliary grooves are formed by etching, particularly by dry etching, and the second auxiliary grooves are formed by using a laser scribing apparatus. The first and second auxiliary grooves may be formed in a same process. In such a case, the first and second auxiliary grooves are formed to substantially the same depth. Therefore, the first and second auxiliary grooves are preferably formed by separate processes. Otherwise, as shown in the examples hereinafter provided, the grooves may be formed through multiple steps. For example, after the first auxiliary grooves are formed in a rectangular shape as shown in FIG. 2C in solid lines 16B and 16C, the second auxiliary grooves are formed respectively over a part of each first auxiliary groove. In addition, the second auxiliary groove 31 shown in FIG. 3B may be formed over a part in longitudinal direction of the first auxiliary grooves 30 at locations shown in FIG. 3A in dotted lines 31. Thus, such multiple steps can be applied suitably to a case where deeper grooves such as the second auxiliary grooves are formed. In the examples of the present specification, the second auxiliary grooves are formed after forming the first auxiliary grooves, but the grooves may be formed in the opposite order, which can be applied suitably in a case where the first and second auxiliary grooves are spaced apart each other. Thus, in a case where the first and second auxiliary grooves are connected with each other, the second auxiliary grooves are preferably formed after the first auxiliary grooves are formed. In this case, the second auxiliary grooves are formed overlapping with at least a part of the first auxiliary grooves, respectively, preferably the second auxiliary grooves are formed respectively in the first auxiliary grooves with a length shorter than the first auxiliary grooves. More preferably, the second auxiliary grooves are formed so that the first auxiliary groove is divided and continuous to the both ends of the second auxiliary groove.

Figure 5:
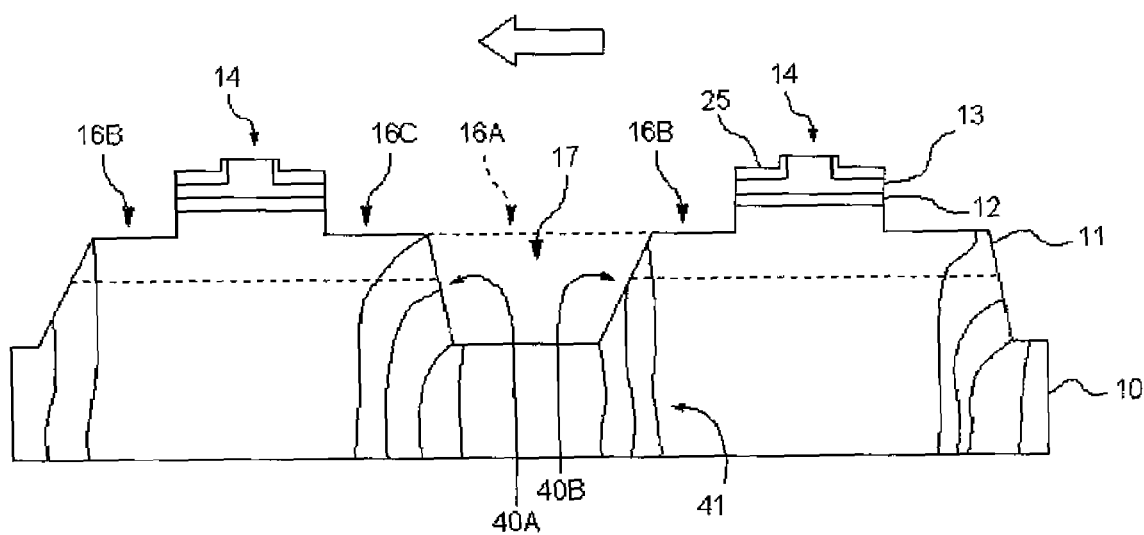
FIG. 5 is a schematic cross sectional view illustrating an embodiment of the present invention.

FIG. 5 is a schematic cross sectional view illustrating a method described in embodiments and examples of laser element to be described below, that is, a cleaved cross section of a element obtained by a laser processing the second auxiliary grooves 17 in a part of the first auxiliary grooves 16A to 16C. Also, FIG. 5 illustrates a schematic cross section corresponding to a wider region (containing two element regions 15) than the enclosed region C shown in FIG. 1. The laser beam scanning direction is from right to left as shown by outlined arrow in the figure. The longitudinal lines mainly crossing the substrate 10 in the figure show the cracks 41 observed under optical microscope.

As shown in the figure, the cracks propagate in the longitudinal direction with respect to the moving direction of the laser beam. More specifically, the cracks propagate at oblique angles at the groove side (element structure side) with respect to the moving direction of the laser beam and then propagate in the longitudinal direction toward the back surface of the substrate. Particularly, many cracks occur from the side surface 40A of the grooves, which is termination side of the laser processing. On the other hand, the cracks at the side surface of the initiation side 40B propagate longitudinally downward with little lateral propagation. The number and frequency of the cracks that occur depend on the characteristics of the grooves and the laser processing condition. Therefore, it is obviously preferable to set the laser processing with an appropriate condition so as to reduce the occurrence of the cracks. There are cases in which damage caused by such cracks or microscopic cracks is difficult to be eliminated completely.

In a case where such cracks occur, the cracks propagating at oblique angles as described above occur in a region adjacent to the grooves, which corresponds to the region of the first auxiliary grooves 16 (16B, 16C) as shown in the figure. Therefore, the first auxiliary grooves 16 are preferably formed corresponding to the crack region. For example, in the first auxiliary grooves 16 (16B, 16C) interposing the dividing region including the ridge 14, the groove 16C at the laser processing initiation side, that is the groove 16C adjacent to the second groove 17 in the FIG. 5, is formed longer than the groove 16B. With this arrangement, the effect of the cracks and damage on the dividing region and/or the element structure can be avoided or reduced. In addition, similar advantageous effect can be obtained in a region between adjacent second auxiliary grooves, by positioning the element structure and dividing region closer to one groove than the other groove, that is, by positioning them closer to one groove rather than positioning them in the center of the region.

In the example of the second auxiliary groove 17 shown in FIG. 5 to be hereinafter described, when the second auxiliary groove 17 is formed by laser processing, the above-described dividing guided by the grooves may depend on the moving direction of the laser beam. In this case, for example, when the dividing is facilitated with respect to the direction perpendicular with the moving direction of the laser beam, the laser beam is preferably moved along the dividing line $L_B$ of the groove 17 in FIG. 4, and when the dividing is facilitated the other way around, the laser beam is preferably moved along the longitudinal direction of the groove 17. In the latter case, the problem of the above-described cracks can be solved when the direction is at an angle from the dividing direction $L_B$, preferably at approximately perpendicular direction.

As shown in embodiments and examples of the laser element to be hereinafter described, various grooves, exposed portions, particularly that connecting to the first auxiliary grooves can be formed in the same step of the first auxiliary grooves.

Figure 3A:
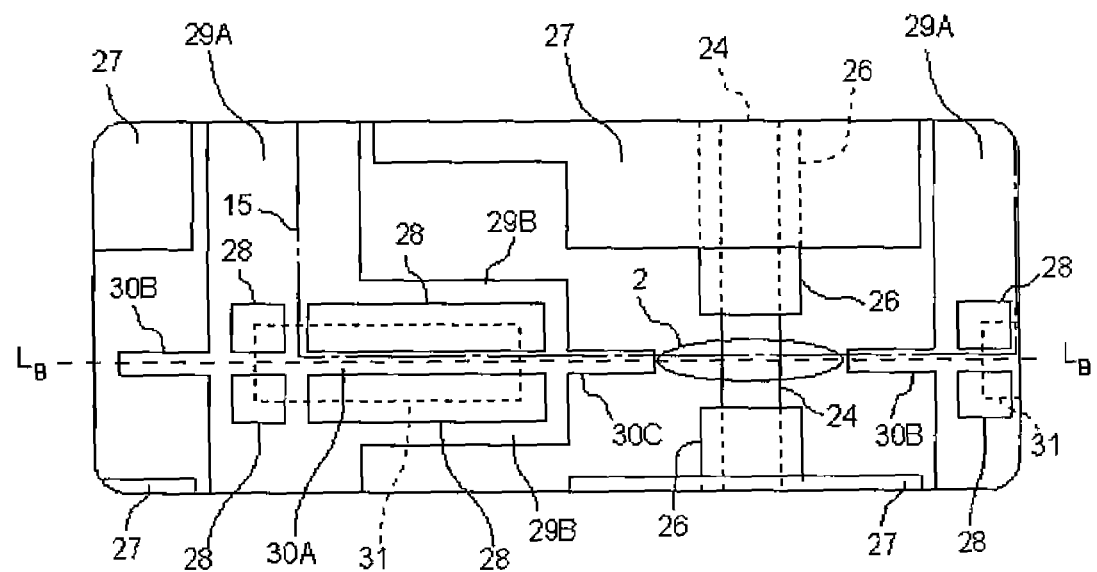
FIG. 3A is a schematic plan view illustrating an embodiment of the present invention.
Figure 3B:
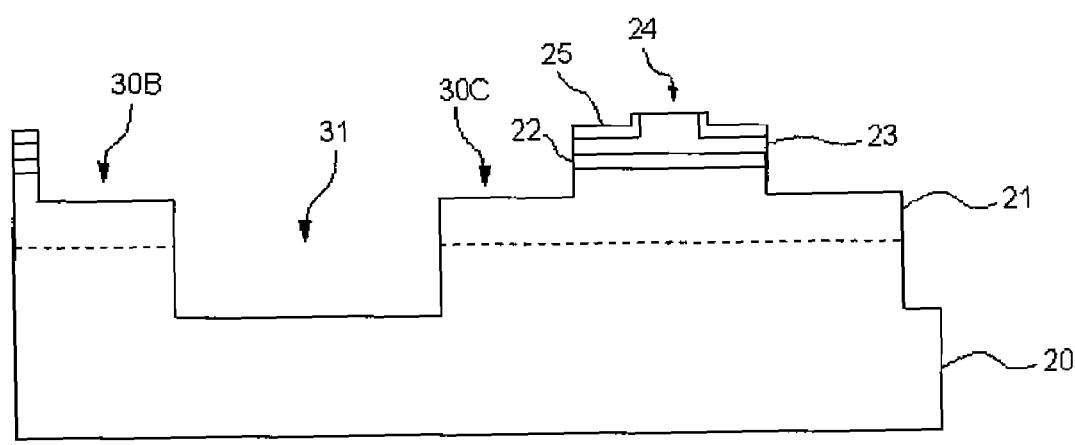
FIG. 3B is a schematic cross-sectional view taken along line $L_B$-$L_B$ of FIG. 3A.

In a specific example, dividing grooves dividing a part or entire portion between the element regions 15 or exposed regions exposed in the dividing direction or dividing locations may be provided. Examples thereof include, as shown in the example in FIG. 3A, the island-shaped portion 28 to form the second auxiliary groove 31 therein, the surrounding groove 29B surrounding the island-shaped portion 28, and the exposed region 29A approximately perpendicular to the dividing line $L_B$. Here, FIGS. 3A and 3B illustrate an another example of the region corresponding to the region C of FIG. 1A. The exposed region 29A serves as a dividing groove dividing the element region 15, that is, dividing the element regions 15 along the dividing line $L_B$. Thus, the exposed regions 29A can serve for electrical division and as dividing grooves at the time of dividing. Particularly, scratches may be made by using a scriber to the exposed region 29 as the dividing grooves at the time of dividing, then dividing can be conducted along the grooves. In addition, the second auxiliary grooves 31 are formed in the regions of the surrounding grooves 29B and the island-shaped portions 28 so as to suppress the effect of the damage on the elements (regions 15), due to the formation of the grooves. At this time, the surrounding grooves preferably surround approximately the entire portion of the groove forming regions as shown in the figure, but the surrounding grooves may be provided so as to surround a part of the groove forming regions, particularly, so that the region where the element regions and the grooves face each other is divided. The island-shaped portion 28 may be separated by the groove portion 30A or the like as shown in the figure. The remaining region in the island-shaped portion 28 after forming the groove 31 serves as a protective wall. The protective effect can be improved by the surrounding groove and the protective wall, against contamination, damage due to the groove processing, and leak caused thereby. For this, it is preferable to provide a remaining island-shaped portion in the island-shaped portion so as to surround approximately entire region of the grooves 31 as in the surrounding groove portions. A configuration may be such that a remaining island-shaped portion may be provided to a part of the region, particularly, so as to divide the region where the element region and the grooves face each other. In addition, it is preferable that the island-shaped portion or the remaining portion thereof is provided at the second auxiliary groove side between the surrounding grooves 29B, exposed regions 29A and the second auxiliary grooves.

In the example in FIGS. 3A and 3B, each region, the first auxiliary grooves 30, and the regions 29 are connected with each other as the same exposed region, but they may be spaced apart from each other. Further, in examples to be described below, they are formed in the same step, but they may be formed in separate steps.

Embodiments used for the nitride semiconductor laser elements are described below. The present invention can be applied not only to the laser elements but also to the light emitting elements and the electric elements such as HEMTs.

In order to conduct a method of manufacturing the nitride semiconductor laser element according to the present invention, a element structure of a stacked layer, in which a first conductive type nitride semiconductor layer, an active layer, and a second conductive type nitride semiconductor layer formed in sequence on a substrate, is used. In a specific structure, a element structure is provided on a first main surface of a substrate, and an electrode is disposed on a second main surface of the substrate.

The substrate for the semiconductor stacked layer used herein may be an insulating substrate such as sapphire, spinel ($MgAl_2O_4$), or silicon carbide, silicon, ZnS, ZnO, GaAs, diamond, or an oxide substrate which are capable of lattice junction with nitride semiconductor such as lithium niobate, neodymium gallete. In the present invention, particularly, semiconductor substrates and nitride semiconductor substrate (GaN, AlN or the like) are particularly preferable. In a case where the substrate is made of a material different than a semiconductor material, it is possible that the substrate for stacked layer is removed to obtain a single body of the semiconductor stacked layer and a part thereof is used with a semiconductor substrate. The nitride semiconductor substrate more preferably has, for example, an off-angle in a range of about 0.03 to 10° at the main surface and/or the second main surface. The thickness thereof may be in a range of about 50 μm to about 10 mm. The nitride semiconductor substrate can be formed by using a vapor deposition method such as MOCVD method, HVPE method, or MBE method, hydrothermal method, high-pressure method, flux method, fusion method, or the like.

Examples of the single semiconductor substrate include a substrate where the semiconductor layer is formed by using ELO method and periodically or alternately growing, or otherwise in-plane distributing low-dislocation density region (for example, first region) and high-dislocation density region (for example, second region). In a substrate made of such a semiconductor layer by using other lateral growth methods, regions having different crystal defect density, crystal orientation, or the like are similarly distributed.

For example, the substrate may be such that the dislocation density is periodically distributed in a stripe shape within a plane, or the regions having different polarity are distributed. The polarity may be divided in a stripe shape as the first region and second region as described above. In the present specification, "low dislocation density region" refers to a region in which the number of dislocation per unit area is $1 \times 10^7/cm^2$ or less, preferably $1 \times 10^6/cm^2$ or less, and "high dislocation density region" refers to a region in which the dislocation density is higher than that. The dimension of the stripe-shaped distribution in the substrate may be such that the first region has a width of 10 μm to 500 μm, further of 100 μm to 500 μm, the second region has a width of 2 μm to 100 μm, or μm to 50 μm.

In the stripe shape, each region may be distributed in a dotted line shape in the stripe direction. These dislocation can be measured by CL observation or by TEM observation.

In addition, the nitride semiconductor substrate may have, as described above, distribution of different crystal growth planes, crystal planar orientations, or deviations thereof. For example, in the above-described example, if the first region is (0 0 0 1) plane, the second region has a crystal planar orientation different than (0 0 0 1) plane, such as (0 0 0 −1) plane, (1 0 −1 0) plane, (1 1 −2 0) plane, (1 0 −1 4) plane, (1 0 −1 5) plane or (1 1 −2 4) plane. Particularly, (0 0 0 −1) plane is preferable.

For the stacked-layer formed on the first main surface of the substrate, a nitride semiconductor having the general formula of $In_xAl_yGa_{1-x-y}N$ ($0 \leq x \leq 1$, $0 \leq y \leq 1$, and $0 \leq x+y \leq 1$) may be used. In addition, as the group III element, a part thereof may be substituted with B, or as the group V element, a part of N may be substituted with P or As. In the present specification, the "first conductive type" and the "second conductive type" indicate either n-type and p-type, or p-type and n-type. The n-type nitride semiconductor layer contains at least one element of group IV element such as Si, Ge, Sn, S, O, Ti, Zr and Cd, or group VI element, as the n-type dopant. The p-type nitride semiconductor layer contains, as the p-type dopant, Mg, Zn, Be, Mn, Mn, Ca, or Sr etc. It is preferable that the doped concentration is, for example, about $5 \times 10^{18}/cm^3$ to about $1 \times 10^{21}/cm^3$. The above-described n-type or p-type layer may be provided to a part of the layer or region of the first conductive type semiconductor layer and the second conductive type semiconductor layer.

In addition, a buffer layer, an intermediate layer (for example, $Al_xGa_{1-x}N$ ($0 \leq x \leq 1$)) or the like may be provided on the substrate before forming a stacked layer body functioning as a laser element.

For example, a first conductive type nitride semiconductor layer (hereinafter may be referred to as a "n-type semiconductor layer"), an active layer, a second conductive type nitride semiconductor layer (hereinafter may be referred to as a "p-type semiconductor layer") are grown in this order to obtain a stacked layer body. The n-type semiconductor layer and the p-type semiconductor layer may have a single-layer structure, multi-layer structure, or super lattice structure made of two layers having different composite rate. A composite gradient layer or a concentration gradient layer may be provided in such layers. Such a stacked layer body functions to amplify, or resonate light generated in the active layer. In a specific example, a cladding layer for optical confinement is provided to each conductive type semiconductor layer, and an optical waveguide, in which light is amplified or resonated in the core region, is provided between both of the cladding layers.

The stacked layer body may have a SCH (Separate Confinement Heterostructure), in which an optical guide layer is provided to the first conductive type semiconductor layer and/or the second conductive type semiconductor layer. The optical guide layer in the first conductive type semiconductor layer and the optical guide layer in the second conductive type semiconductor layer may have composition and/or thickness different from each other. The optical guide layer may be omitted from one of the conductive type semiconductor layer side, particularly from the second conductive type layer side, or from the both sides.

The n-type semiconductor layer may have a structure including two or more layers having different composition and/or dopant concentration. For example, the n-type semiconductor layer may have two-layer structure of the first layer of cladding layer and the second layer of optical guide layer.

Other layers may also be added thereto. The first n-type semiconductor layer may be made of $Al_xGa_{1-x}N$ ($0 \leq x \leq 0.5$), preferably $Al_xGa_{1-x}N$ ($0 \leq x \leq 0.3$). The thickness of about 0.5 to 5 μm is suitable for the cladding layer. The second n-type semiconductor layer may be formed by, for example, InGaN, AlGaN, or GaN, as an optical guide layer, with a suitable thickness of 0.1 to 5 μm.

The active layer may have either multi quantum well structure or single quantum well structure. The well layer preferably represented by general formula $In_xAl_yGa_{1-x-y}N$ ($0 < x \leq 1$, $0 \leq y < 1$, $0 \leq x+y \leq 1$) in which at least In is included. Rising the Al content enables the emission in ultraviolet region. Emission can be obtained in a wavelength region of about 300 nm to about 650 nm. Other than the quantum well structure, a p-n junction structure or a double hetero structure may be employed.

The p-type semiconductor layer stacked on the active layer may be a single layer, but may be a multi-layer structure of, for example, the first layer of electron confining layer, the second layer of optical guide layer, the third layer of light confining layer, and the fourth layer of contact layer, to which another layer can also be added.

The first p-type semiconductor layer is formed as the p-side electron confining layer, and made of $Al_xGa_{1-x}N$ ($0 \leq x \leq 0.5$) containing a p-type dopant. The second p-type semiconductor layer is provided as the optical guide layer, and can be made of InGaN, AlGaN, or GaN. The third p-type semiconductor layer is provided as the cladding layer, and can be made of $Al_xGa_{1-x}N$ ($0 \leq x \leq 0.5$) containing a p-type impurity. Other than this, a multilayer structure of super lattice made of GaN or AlGaN and AlGaN. The fourth p-type nitride semiconductor layer is provided as the contact layer, and can be made of $Al_xGa_{1-x}N$ ($0 \leq x \leq 1$) containing a p-type dopant. Here, the first p-type semiconductor layer and the second p-type semiconductor layer can be omitted. The thickness of each layer of about 3 nm to about 5 μm is suitable.

Growth method of the nitride semiconductor layer is not specifically limited and any known methods for growing a nitride semiconductor such as MOVPE (metal organic vapor phase epitaxial growth method), MOCVD (metal organic chemistry gaseous phase growth method), HYPE (hydride vapor phase epitaxy) and MBE (molecular beam epitaxy) can be used suitably. Especially, MOCVD is preferable, because good crystallinity can be obtained under reduced pressure or at atmospheric pressure by using this method.

Next, the exposed region is formed.

The exposed regions 29A, 29B are formed, for example, as shown in FIG. 1A, FIG. 3A, at the surface of the stacked layer to surround a part or entire portion of the outer border of the region 15 constructing the laser element. The exposed region 29A is formed approximately in parallel to the resonator direction, in the region of one or both sides adjacent to the element region. With this arrangement, for example, the second conductive type nitride semiconductor layer of the stacked layer body is divided into the element region 15 and the island-shaped region 28. In the present specification, "element region 15" refers mainly to a region in the stacked layer body that serves as the laser element, and has a stacked body of element structure which include a region having an optical wave guide.

The exposed regions 29A, 29B are formed by removing at least the second conductive type nitride semiconductor layer and the active layer from the second conductive type nitride semiconductor layer side. In addition, when needed, the first auxiliary grooves may be formed by removing the first conductive type semiconductor layer, and further removing a part of the semiconductor substrate. The removal of these layers are achieved by forming a predetermined mask pattern as in the formation of the ridge, and using it as a mask, conducting etching in the depth direction of the stacked layer body.

The shape of the exposed region 29A is not specifically limited, and it is formed with various shapes such as a rectangular shape, corresponding to the shape of the laser element region, in at least a part of the outer edge region thereof. The length of the exposed region 29A (length in the resonator direction) may be determined suitably according to the length of the resonator. Here, it is preferable that each dimension of the laser devise is such that the length of the resonator is about 200 to 1200 μm, the width of the laser element region (direction of the resonance surface) is about 100 to 500 μm, the width of the element region 15 (direction of the resonance surface) is about 30 to 400 μm. As shown in FIG. 1, typically, a plurality of the element regions are formed in a wafer, and the exposed region are formed corresponding to each element region 15 or to the portion between the regions. For example, as shown in FIG. 3, in a case where a plurality of elements are formed on a wafer adjacent to each other, the exposed regions 29A are formed between the adjacent elements, and each piece of the element can be obtained by dividing the wafer at the exposed regions at the time of secondary cleavage.

Varying the width (directions of the resonance surface, dividing lines $L_B$) of the entire exposed region 29 (29A, 29B) as shown in FIG. 3A allows to correspond to specific nitride semiconductor substrate, for example, arrangement of the above-described first region and/or second region, dislocation density, crystal fault density, dopant concentration, degree of the surface roughness, difference in the crystal plane, or the like. Thus, a good laser property can be realized with the stacked layer body of the nitride semiconductor layer formed on the substrate. As described above, by forming the exposed region with a width corresponding to the arrangement of the first region and/or the second region and the like, the regions having relatively great number of crystal faults and dislocation density in the substrate and the semiconductor layer stacked thereon can be divided from the active layer or the like constructing the resonator. Thus, prevention of the leak current or the like caused by the dislocation or crystal fault in the active layer can become possible.

The island-shaped portions 28 can be formed at the time to form the exposed regions and the first auxiliary grooves, with the remaining portions of the active layer and the second conductive type nitride semiconductor layer which are separated in an island shape in a part of the exposed region. Here, the island shaped portions 28 are preferably formed such that the second conductive type nitride semiconductor layer and the active layer are separated from the element region and formed with a shorter length than the resonator in the resonator direction. In the example shown in FIG. 3, the island shaped portions 28 are formed to interpose the intended dividing locations $L_B$ and the first auxiliary grooves thereon. The dimensions of the island shaped portions are preferably such that the length (length in the resonator direction) thereof is about 1/100 to 1/5 with respect to the length of the resonator L, the width (length in the direction of the resonance surface and dividing direction $L_B$) is about 1/50 to 1/2 with respect to the width of the element region, in a specific example, the length is about 3 to 100 μm, preferably about 5 to 50 μm, the width is about 3 to 100 μm, preferably about 5 to 50 μm. In a case where the island shaped portions are formed in a rectangular shape as shown in FIG. 3A, it is suitable that the ratio between the width of the island shaped portion and the length thereof is in a range of about 10:1 to 1:10. A single or a plurality of the island shaped portions may be formed in an exposed region formed in a side of the element. In a specific example, as shown in FIG. 3A, the island shaped layers are arranged to interpose the first auxiliary grooves, and to interpose the grooves for the secondary dividing in the exposed region 29A.

The island shaped portions are preferably arranged outer side of the element region than the first auxiliary grooves 30C. Generation of stress, distortion, and warpage of wafer due to the formation of the stacked layer body on the substrate can be reduced by removing a part of the stacked layer body in the exposed region described above. Particularly, removing the stacked layer body such as the resonator and the ridge 24 in the vicinity of the central portion of the element region 15 enables to effectively reduce the warpage while suppressing the generation of cracks. Thus, smooth handling of the wafers in a manufacturing process can be achieved, enabling efficient manufacturing of the laser elements with stable quality.

Commonly, manufacturing of the semiconductor laser element includes a primary dividing step (primary cleavage) $L_B$ in the figure to form the resonator surface, and also includes a secondary dividing step (secondary cleavage) to divide in the resonator direction. The island shaped portions 28 described above are separated by the grooves formed corresponding to the exposed region 29A in the direction of secondary cleavage. Thus, the grooves interposed between the island-shaped portions serve as the auxiliary groove in the secondary cleavage, so that the process yield in the secondary cleavage can be improved.

The elements, and the element regions and the second auxiliary grooves are electrically and physically divided by the island shaped portions, respectively. For example, even if adhesion of dust or the like occurs on the side surfaces of the chips at or after the secondary dividing step, the element regions and the island shaped portions are insulated from each other as described above, so that the generation of a leak current and damage of the crystal resulting therefrom can be prevented.

The island shaped portions are needed to be disposed at least on the emission side of the resonator end surface, but it is preferable to dispose them on the other side. In addition, the island shaped portions are preferably arranged, at least on the emission side of the resonator end surface, opposite each other with respect to the ridge, preferably symmetrically along the ridge. With this arrangement, dividing accuracy can be improved and good resonator end surface can be formed.

Subsequently, the first auxiliary grooves are formed. The auxiliary grooves are formed extending in a direction orthogonal to the resonator direction. In the example shown in FIG. 3, the first auxiliary grooves are formed in or adjacent to the island shaped portions, specifically, are formed longer than the island shaped portions and separate it in the wafer. The first auxiliary grooves are needed to be formed at least one of the resonator surface. In addition, the first auxiliary grooves may be arranged spaced apart from the exposed region 29A. The first auxiliary grooves are preferably formed continuously from the island shaped portions 28 to the element region 15. The first auxiliary grooves are preferably arranged spaced apart from the ridge 24 and interposing the ridge 24 and the dividing region 2 in which the resonator end surfaces are to be formed.

The laser element structure preferably have a ridge serving as a waveguide region formed on the surface of the stacked layer body, that is, on the second conductive type semiconductor layer. The width of the ridge is suitably in a range about 1.0 μm to about 50.0 μm. In the case where the beam shape is a single mode, the ridge width may be in a range about 1.0 μm to about 3.0 μm. The height of the ridge (the etching depth) can be suitably adjusted depending on the thickness of the layer constituting the p-type semiconductor layer, the vertical structure of the stacked layer body, the lateral relationship with the buried layer to be described below, or the like, for example, a height in a range of 0.1 to 2 μm can be employed.

The ridge can be formed by disposing a mask pattern on the nitride semiconductor layer, and then carrying out an etching step. The mask can be formed, for example, depositing a resist, an oxide film such as $SiO_2$, or a nitride film such as SiN by using, for example, a CVD apparatus. Then, the film is formed in a desired shape by using a known method such as photolithography and etching step. The thickness of the mask is suitably chosen such that after the ridge has been formed, the remaining mask on the ridge can be removed by way of lift-off in a subsequent step. About 0.1 to 5.0 μm is suitable, for example. It is preferable to carry out a step of patterning by using RIE method or the like, for example. In this case, the etching is suitably performed with halogen type gas. In addition, it is suitable to perform it using, for example, a chlorine-based gas such as $Cl_2$, $CCl_4$ and/or $BCl_3$, and a fluorine-based gas such as $CF_4$, $CHF_3$, $SiF_4$. Thereafter, using a mask pattern, etching is performed on the nitride semiconductor layer to form the ridge (14 in FIG. 1 and FIG. 2). It is preferable to carry out the etching by using RIE method with, for example, a chlorine-based gas. The ridge may be formed either before or after the exposed region and each auxiliary groove are formed.

Also, the laser element may have a structure in which, instead of the ridge waveguide, a current confinement layer is employed, or a ridge is formed and current confinement layer is employed. Other laser element structures can also be employed.

Subsequently, the second auxiliary grooves are formed. The second auxiliary grooves are preferably formed after the electrode has been disposed on the second main surface of the substrate and before performing the primary cleavage. This is intended to facilitate the handling of the wafers in the manufacturing steps so that the laser elements of stable quality can be manufactured efficiently. The second auxiliary grooves are preferably formed deeper than the first auxiliary grooves, for example, as shown in FIG. 3A, so that a part of the second auxiliary grooves are formed overlapping at a part with the first auxiliary grooves 30. Further, in a case where the island shaped portions are formed, the second auxiliary grooves are preferably provided within the region 28 allocated for the island shaped portions.

As described above, in a case using a nitride semiconductor substrate having regions of relatively large number of crystal faults, relatively high dislocation density (distribution of the first and second regions), or the like, the elements may be broken by cleavage in an unintended direction. Such breakage can be prevented and the yield with cleavage can be improved by providing the second auxiliary grooves.

The second auxiliary grooves may be formed by etching in a similar manner as in the exposed regions and the first auxiliary grooves, or may be formed by using other methods. When etching is employed, the second auxiliary grooves may be formed either in the same step as forming the exposed regions and/or the first auxiliary grooves simultaneously or in other steps. The second auxiliary grooves may also be formed by laser processing, specifically by using a laser scriber (an apparatus made by DISCO, an apparatus made by Laser Solution, an apparatus made by Opto-System, or the like). In forming the second auxiliary grooves, it is preferable to suitably adjust the focal spot of the laser beam being used by adjusting the size of the incident laser beam, the scattering angle generated during propagation, the focal distance, and so fourth, and to suitably adjust the focal depth by means of the wavelength, the focal spot size, the focal distance, and so forth. As an example, the wavelength of the laser beam being used may be about 150 nm to about 600 nm, and the energy may be about 0.1 W to about 10 W. In a case where the second auxiliary grooves are formed by a laser scribe method, the p-n junction therein may be damaged, causing a leak current. However, providing the second auxiliary grooves in a region in the island shaped portion enables to prevent the generation of leak current.

In a case where a plurality of element regions of the laser element are formed in a matrix or in the resonator direction or a direction perpendicular to the resonator direction on the substrate (wafer), the second auxiliary grooves are preferably formed in the entire substrate at once in this step. When the second auxiliary grooves are formed in this way, the groove formation portion of the entire wafer can be recognized by image recognition in wafer units, so that the second auxiliary grooves can be formed in all the element regions on a wafer in a single operation. Thus, the processing steps can be simplified, so that the processing time for forming the second auxiliary grooves in the wafer can be reduced.

Optionally, washing may be performed after the second auxiliary grooves are formed. That is, scattered material such as a metal element contained in the nitride semiconductor layer which is removed by the energy of the laser beam may adhere to the inner surface of the grooves, the surface of the exposed region surrounding the grooves, or the like. Such contamination may adversely affect the performance of the element. Therefore, such scattered material or the like is preferably washed by a known method, such as dipping, rinsing, or ultrasonic washing using a suitable etchant, such as a single acid or a mixed acid liquid of nitric acid, hydrofluoric acid, sulfuric acid, hydrochloric acid, acetic acid, hydrogen peroxide, or the like, a single alkaline such as ammonia or a mixed liquid of ammonia and hydrogen peroxide, or any of various surfactants. If the washing is performed before dividing, before formation of the resonators, the resonator surfaces are not exposed to the etchant, so that the scattered material can be effectively removed without damaging the resonator surfaces.

It is preferable to form as a first protective film on the both side surfaces of the ridge and the surface of the second conductive type semiconductor layer in an appropriate step after forming the ridge stripe. The first protective film can serve as a buried layer in the ridge. Examples of the material for the first protective film include an oxide and a nitride of Ti, Al, Zr, V, Nb, Hf, Ta, Ga, and Si. The first protective film can be formed with a single-layer or stacked-layer structure by using any of various methods known in this field, such as CVD method, vapor deposition, ECR (electron cyclotron resonance plasma) sputtering, or magnetron sputtering. A stacked layer film made of films with different composition and quality may be employed alternative to a single layer film. In addition, after forming the first protective film, anneal may be performed for the electrode and the p-type layer to be described below.

A p-electrode is preferably disposed on the surface of the second conductive type semiconductor layer (in a case where a ridge is formed, on the surface thereof). If the p-electrode has a two-layer structure composed of nickel and gold, for example, first a film of nickel is formed with a thickness of about 5 to 20 nm on the p-type semiconductor layer, and then a film of gold is formed with a thickness of about 50 to about 300 nm. When the p-electrode is made with a three-layered structure, the layers are disposed in order of Ni—Au—Pt or Ni—Au—Pd.

Optionally, a pad electrode may be formed on the p-electrode. The pad-electrode is preferably has a layered structure made of metals such as Ni, Ti, Au, Pt, Pd and W. Examples of the pad electrode include sequentially formed films of W—Pd—Au, Ni—Ti—Au, or Ni—Pd—Au in this order, starting from the p-electrode side. In an appropriate step, for example, after forming the p-electrode, ohmic annealing is preferably performed. Suitable annealing conditions include, for example, a temperature of at least about 300° C., and preferably at least about 400° C., in an atmosphere containing nitrogen and/or oxygen.

Also, at some stage, another protective film (second protective film) such as a film made of the similar material as the first protective film, dielectric film, insulating film or the like, may be formed on the first protective film after the first protective film has been formed.

At some stage, it is preferable to polish the second main surface of the substrate, for example, before forming the n-electrode. Further, an n-electrode is preferably formed on a part or entire surface of the second main surface of the substrate. The n-electrode can be formed, for example, by way of sputtering, CVD, or vapor deposition. The lift-off method is preferably used to form the n-electrode, and annealing is preferably performed at about 300° C. or higher after the n-electrode has been formed. The n-electrode may be formed with a total thickness of about 1 μm or less, and of, for example, V(10 nm thick)-Pt(200 nm thick)-Au(300 nm thick), Ti(10 nm thick)-Al(500 nm thick), or Ti(6 nm thick)-Pt(100 nm thick)-Au(300 nm thick), or Ti—Mo—Pt—Au, Ti—Hf—Pt—Au, W—Pt—Au, or W—Al—W—Au, starting from the substrate side. The n-electrode is preferably parted by expose a region on the second main surface of the substrate opposite to the portion over the laser scribed groove described below and/or the scribing region or cleavage line for forming the resonator end surface described below. The n-electrode may be formed, in this stage or any stage thereafter, not on the second main surface of the substrate but on the exposed region of the first conductive type semiconductor layer.

Thereafter or at any appropriate stage, the wafer may be annealed in a reaction chamber in a nitrogen atmosphere, at a temperature of about 700° C. or higher to reduce the resistance of the p-type semiconductor layer.

The bar-shaped substrate and the stacked layer body is divided at the first and second auxiliary grooves in the resonator direction. A known method can be used for the dividing. Various methods such as blade breaking, roller breaking, and press breaking can be used. In addition, dividing in a direction other than the direction of the groove, the substrate and the stacked layer body can be cleaved and divided by placing a circular roller or blade or the like to the substrate side, and applying a concentrated stress thereon.

With this, chips that constitute one unit of a semiconductor laser element can be obtained.

Also, in a case where the resonator end faces are optionally formed, a dielectric film may be preferably formed on the resonator end surfaces, that is, on the light-reflecting side of the resonator surface and/or the light emitting surface. It is preferable that the dielectric film is either a single layer or a multi-layer of $SiO_2$, $ZrO_2$, $TiO_2$, $Al_2O_3$, $Nb_2O_5$, AlN, AlGaN, or the like.

Example 1

Example 1 of the present invention illustrates a structure of a laser element and a method of manufacturing the same.

First, a nitride substrate made of n-type GaN with a thickness of 400 μm is set in a MOVPE reaction vessel, and a nitride semiconductor layer to be described below is stacked to form an element structure. The surface of the substrate is C-plane and the semiconductor crystal to be described below is grown along the c-axis.

As a first conductive type semiconductor layer 11, a first layer of n-$Al_{0.02}Ga_{0.98}N$ doped with about $10^{18}/cm^3$ of Si and a second layer of n-$In_{0.04}Ga_{0.96}N$ doped with about $10^{18}/cm^3$ of Si are grown, and thereon, an n-type cladding layer of $Al_{0.11}Ga_{0.89}N$ doped with about $10^{18}/cm^3$ of Si, and an n-side optical guide layer of undoped $Al_{0.06}Ga_{0.94}N$ are grown.

Next, as an active layer 12, a barrier layer of $Al_{0.15}Ga_{0.85}N$ doped with about $10^{19}/cm^3$ of Si, an undoped well layer of $In_{0.01}Ga_{0.99}N$, and a barrier layer of $Al_{0.15}Ga_{0.85}N$ are grown to form a single quantum well structure (SQW).

Next, as a second conductive type semiconductor layer 13, a p-side electron confining layer of p-type $Al_{0.30}Ga_{0.70}N$ doped with about $10^{20}/cm^3$ of Mg, a p-side optical guide layer of undoped $Al_{0.06}Ga_{0.94}N$ (in which, the concentration of Mg approaches about $10^{17}/cm^3$ due to Mg diffusion from the p-side electron confining layer), a p-side cladding layer having a superlattice structure having a total thickness of 0.6 μm made of 120 pairs of an undoped $Al_{0.13}Ga_{0.87}N$ layer with 2.5 nm thickness and an $Al_{0.09}Ga_{0.91}N$ layer having Mg concentration of about $10^{19}/cm^3$ with a 2.5 nm thickness, and a p-side contact layer of p-type GaN having a thickness of 15 nm doped with about $10^{20}/cm^3$ of Mg are grown.

Next, a semiconductor wafer having a element structure of a nitride semiconductor layer on the substrate 10 is taken out of the reaction vessel and a mask made of SiO2 is disposed on the p-side contact layer with a desired shape and pattern. Then, etching is carried out using the mask from the p-side contact layer side to a part of n-side cladding layer to form exposed regions of the n-cladding layer (exposed regions 29A as shown in FIG. 3) and first auxiliary grooves 16 as shown in FIG. 1. Subsequently, a mask pattern made of stripe-shaped $SiO_2$ with a width of 2.3 μm is disposed on the p-side contact layer which is the uppermost layer of the element region. Then, using RIE (reactive ion etching), etching is carrier out to a depth near the boundary of the p-type cladding layer and the p-side optical guide layer to form a stripe-shaped ridge (ridges 14 in FIG. 1).

Next, with the mask retained, a protective film made of a stacked-layer of $Al_2O_3$ with 20 nm in thickness and $ZrO_2$ with 180 nm in thickness is formed on the surface of the nitride semiconductor layer, and annealing is carried out at 400° C. Subsequently, the mask pattern disposed on the p-side contact layer is removed by dissolving, and the protective film disposed on the p-side contact layer is removed by way of lift-off together with the mask made of $SiO_2$. Accordingly, a buried layer of $SiO_2$ and $ZrO_2$ (such as layer 25 shown in FIG. 3) is provided to each side surface of the ridge and the p-side guide layer exposed to the side thereof.

Subsequently, a p-side ohmic electrode is disposed in a stripe-shape wider than the ridge over the outermost surface of the p-side contact layer, so as to cover the protective film. Then, a p-side pad electrode electrically connected with the p-side ohmic electrode is disposed thereon.

Further, by using a laser scribing apparatus, laser beam is applied in dotted line to form second auxiliary grooves in a central portion of the first auxiliary grooves.

Each dimension in the present Example is such that: the length of the resonator is about 600 μm, the width of the exposed region 29A is about 30 μm, the width of the second auxiliary groove (cleavage direction) is about 60 μm and the length thereof (in the direction perpendicular to the cleavage direction) is about 10 μm, each width of the first auxiliary grooves (cleavage direction) at the both ends of the second auxiliary groove is about 25 μm, and the length (in the direction perpendicular to the cleavage direction) thereof is about 1 μm (the length of the first auxiliary groove at the time of forming is about 110 μm), the distance between the second auxiliary groove and the ridge 14 in the longitudinal direction of the auxiliary groove is about 30 μm, and the width of the element region including the ridge is about 140 μm.

Also, the back surface of the substrate is polished to the thickness of about 80 μm and an n-side ohmic electrode is disposed on the back surface (polished surface) of the n-type GaN substrate.

Thereafter, the wafer is divided into bars by cleaving the GaN substrate, for example, along the intended cleavage line $L_B$ in FIG. 1, and resonator surfaces are formed at the cleaved planes of the bars.

A dielectric film is formed on the resonator surfaces of the laser bars. On the emission side, an $Al_2O_3$ film is formed with a thickness of 70 nm, and on the reflecting side which is opposite side of the emission side, a stacked layer of $ZnO_2$ and $SiO_2$ (total thickness of 700 nm) is formed.

Thereafter, chips are produced by dividing the bar-shaped wafers in a direction approximately parallel to the resonator direction, for example, along the ridge 14 direction in FIG. 1, at the region between the element region 15 (exposed region 29A shown in FIG. 3).

As shown in FIGS. 1A to 1C, the semiconductor laser element thus obtained has a laser oscillation wavelength of 375 nm, and has a structure in which an n-type semiconductor layer 11, an active layer 12, and a p-type semiconductor layer 13 with a ridge 14 formed on its surface, are stacked on a substrate 10, and a protective film (not shown) is formed on each side of the ridge 14. Also, a p-electrode (not shown) electrically connected to the ridge 14 and an n-electrode (not shown) electrically connected to the substrate 10 are formed. Further, a second auxiliary groove is arranged at each of the four corners of the laser element, with a length of about 30 μm, that is a half length of the second auxiliary grooves described above.

In the laser element described above, the defect ratio in the dividing steps using the first and second auxiliary grooves is lower than the dividing step using only the first auxiliary grooves, while maintaining other properties of the laser element.

Example 2

In a similar manner as in Example 1, a wafer having a element structure of a nitride semiconductor layer on a substrate is taken out of a reaction vessel, a mask pattern of a desired shape is disposed on a p-side contact layer, and using the mask pattern, an etching is performed from the p-side contact layer side to a part of an n-side cladding layer to form an auxiliary groove 30. Different from that in Example 1, by forming an exposed region of the n-side cladding layer, as shown in FIG. 3, island-shaped portions 28 and three first auxiliary grooves 30A to 30C which are interposed between the island portions 28 and divided by the exposed region 29B. Here, the exposed region 29B is formed so as to surround the second auxiliary groove 31, and divides the element regions from each other, and divides the second auxiliary groove and the element region 15 from each other. Herein, the width (length in the cleavage direction) of the exposed region 29A is about 30 μm, and in the exposed region, the width of the two island-shaped portion (same as above) is about 62 μm and about 12 μm respectively, and the length (direction perpendicular to the cleavage direction) of the island-shaped portion 28 is 7 μm, and the width (direction perpendicular to the cleavage direction) of the groove-shaped exposed region 29 and the auxiliary groove 30 is about 1 μm. Subsequently, as in Example 1, a ridge 24 is formed and a buried layer 25 (shown in FIG. 3B, not shown in FIG. 3A) at the side surface of the ridge and a p-electrode 26 (shown in FIG. 3A, not shown in FIG. 3B) disposed on the buried layer 25 and the ridge 24 respectively, and a pad electrode 27 (same as on the left) on the p-electrode 26 are formed. Next, as in Example 1, a second auxiliary groove is formed in a part of and in the width direction of a first auxiliary groove. The first auxiliary grooves 30B, 30C are retained at the both ends thereof as in Example 1, the central portion 30A thereof is arranged as the inner portion of the second auxiliary groove 1, and the width 30B, 30C of the first auxiliary grooves at the both ends thereof and the distance between the second auxiliary groove 31 and the ridge are formed in a similar manner as in Example 1 (FIGS. 3A and B).

Next, as in Example 1, the substrate and the element structure are cleaved at the dotted line to form a laser bar having resonator end surface. Then, an end surface film such as the dielectric film described above is disposed on the end surfaces. The laser bars are divided into chips, in this example, along the groove-shaped exposed region between the island-shaped portions having different size at the central portion of the exposed region 29A, to produce the laser elements.

Comparative Example 1

The laser elements are produced in a similar manner as in Example 2, except that the cleavage is carried out without forming the second auxiliary grooves.

In the laser elements of Comparative Example thus obtained, the defect ratio in the above-described cleavage step is about 10 to 40%, and this is considered as a change corresponding to variation in crystallinity of the substrate. The defect ratio may reach about 60% at the worst possible case.

On the other hand, in above-described Example 2, the defect ratio can be reduced to 5% or less, depending on the depth and length of the second auxiliary grooves. In Example 2, other properties of the laser element, life performance, COD level, and ESD characteristics can be comparably obtained. Thus, it is shown that there is little effect from damage caused by the laser scribing.

The laser element is formed in a similar manner as in Example 2 except that the depth of the second auxiliary grooves are about 13 μm, about 23 μm, and about 33 μm, and the element of Comparative Example 1 are formed. Then, the defect ratio in the cleavage step and each of the above-described characteristics of the laser elements are evaluated. As a result, similar defect ratio and characteristics are obtained with the laser elements formed with the second auxiliary grooves of any depths described above. In the elements of Comparative Example 1, the defect ratio is about 30%.

Next, in Example 2, the depth and length of the second auxiliary grooves are varied and further, evaluated with the above described Comparative example 1. The samples of Example 2 with a length of about 60 μm and a depth of about 13 μm, about 23 μm, and about 33 μm, with a length of about 40 μm and a depth of about 20 μm and about 30 μm, and the samples of Comparative Example 1 are prepared and compared. As a result, with the length of about 40 μm, the defect ratio changes depending on the depth, that is, about 14% (with 30 μm depth) and about 22% (with about 20 μm depth). On the other hand, with the length of 60 μm, the defect ratio is about 1% at the three depth, and thus shows little change in the rate. The defect ratio of the samples of Comparative Example 1 is about 35%. The graphic representation of these results reveals that at the length of about 40 μm, the defect ratio changes depending on the depth and a linear relationship can be observed with Comparative Example 1 with a depth of zero. On the other hand, at the length of about 60 μm, such a change is not observed. Thus, depth dependency substantially disappears when the length of the second auxiliary groove exceeds a critical value, such as at about 60 μm described above. On the other hand, depth dependency is observed when it is shorter than the critical value, such as at about 40 μm described above, and shows similar relationship with Comparative Example 1 in which the second auxiliary groove is not provided.

Further, when the second auxiliary grooves are formed with a length of about 60 μm and a wider range of depths of 3 to 80 μm, the defect ratio tends to increase with a depth exceeding about 30 μm described above, and specifically with 40 μm. On the other hand, in a shallow region with a depth of 3 to 10 μm, as in the case with a depth of 13 to 33 μm, the defect ratio changes little, showing a good cleavage step. According to observation of the second auxiliary grooves, the increase in the defect ratio in the deep region is considered due to the trace of laser processing, increase in change of shape particularly at the bottom of the grooves, and increase in the amount of excrescencies produced by laser processing.

Example 3

The element is formed in a similar manner as in Example 1, except that a semiconductor substrate having dislocation-concentrated regions in a stripe-shaped distribution so as to interpose two ridges, and the second auxiliary grooves are provided dividing the region with a wider length (length in dividing direction) with respect to the region.

As described above, in a case of dividing of a substrate with a region having largely different crystallinity by crossing a plurality of times, an adverse effect caused by dividing across the region can be suppressed by forming a second auxiliary groove cross-linking the element regions at the both sides of the region.

INDUSTRIAL APPLICABILITY

The present invention can be used not only for a nitride semiconductor material but also for other semiconductor material such as AlGaAs-based, AlInGaP based materials, further as a element, it can be used for a laser element, a light emitting element and also, for an electric element such as FET and HEMT.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

This application is based on applications No. 2007-286830 filed in Japan on Nov. 4, 2007, the contents of which are incorporated hereinto by reference.

DENOTATION OF REFERENCE NUMERALS 1 to 5: dividing region (region between grooves)
10, 20: semiconductor substrate
11, 21: first conductive type semiconductor layer
12, 22: active layer
13, 23: second conductive type semiconductor layer
14, 24: ridge
15: element region
16 (16A, 16B), 30 (30A, 30B, 30C): first auxiliary groove
17, 31: second auxiliary groove
25: buried layer
26: second electrode
27: pad electrode (second electrode)
28: island-shaped portion
29 (29A, 29B): exposed region

What is claimed is:

1. A method of manufacturing a semiconductor element comprising:
    a step of forming a first auxiliary groove in a semiconductor element structure provided on a semiconductor substrate;
    a step of forming a second auxiliary groove in the semiconductor element structure; and
    a step of dividing the semiconductor substrate and the semiconductor element structure in a direction along the first auxiliary groove and the second auxiliary groove, wherein
    in the dividing direction, a plurality of the second auxiliary grooves are arranged spaced apart from each other, and at least two first auxiliary grooves are arranged spaced apart from each other between at least a pair of adjacent second auxiliary grooves, and
    in the dividing step, a separation region interposed between the two first auxiliary grooves is divided.

2. The method of manufacturing a semiconductor element according to claim 1, wherein the second auxiliary grooves are deeper than the first auxiliary grooves.

3. The method of manufacturing a semiconductor element according to claim 2, wherein the first auxiliary grooves have a depth locating at a part of the semiconductor element structure and the second auxiliary grooves have a depth reaching the semiconductor substrate.

4. The method of manufacturing a semiconductor element according to claim 2, wherein the second auxiliary grooves are wider than the first auxiliary grooves.

5. The method of manufacturing a semiconductor element according to claim 4, wherein in the dividing direction, the second auxiliary grooves are longer than the first auxiliary grooves adjacent to the second auxiliary grooves.

6. The method of manufacturing a semiconductor element according to claim 4, wherein the pair of adjacent second auxiliary grooves are connected to the first auxiliary grooves interposing the separation region.

7. The method of manufacturing a semiconductor element according to claim 6, wherein in the dividing direction, a plurality of units of the first and second auxiliary grooves, with a unit of the second auxiliary grooves and the first auxiliary grooves connected to the both ends of the second auxiliary grooves, are provided spaced apart by the dividing regions.

8. The method of manufacturing a semiconductor element according to claim 7, wherein in the step of forming the second auxiliary grooves, the second auxiliary grooves shorter than the first auxiliary grooves are formed over the first auxiliary grooves.

9. The method of manufacturing a semiconductor element according to claim 4, wherein the second auxiliary grooves are formed by laser processing.

10. The method of manufacturing a semiconductor element according to claim 1, wherein the semiconductor element structure is a laser element structure in which at least a first conductive type semiconductor layer, an active layer, and a second conductive type semiconductor layer are stacked in sequence on the semiconductor substrate.

11. The method of manufacturing a semiconductor element according to claim 10, wherein the first auxiliary grooves are formed exposing the first conductive type semiconductor layer from the second conductive type semiconductor layer side, and the second auxiliary grooves are formed exposing the semiconductor substrate from the second conductive type semiconductor layer side.

12. The method of manufacturing a semiconductor element according to claim 11, wherein the second auxiliary grooves are longer and wider than the first auxiliary grooves, and a pair of adjacent second auxiliary grooves are connected to the first auxiliary grooves interposing the separation region.

13. The method of manufacturing a semiconductor element according to claim 12, wherein the first auxiliary grooves are formed by dry etching, and the second auxiliary grooves are formed by laser processing.

14. The method of manufacturing a semiconductor element according to claim 12, wherein in the dividing step, a resonator surface of the laser element structure is formed in the separation region.

15. The method of manufacturing a semiconductor element according to claim 14, wherein the semiconductor element structure is a nitride-based semiconductor laser element structure and the semiconductor substrate is a GaN substrate.

16. A method of manufacturing a semiconductor element comprising:
    a step of forming a plurality of first auxiliary grooves spaced apart from each other in a semiconductor element structure provided on a semiconductor substrate;
    a step of forming a second auxiliary groove shorter than the first auxiliary grooves over each of at least a pair of adjacent auxiliary grooves so as to connect the first auxiliary grooves to the both ends of the second auxiliary grooves, and
    a step of dividing the semiconductor substrate and the semiconductor element structure in a dividing direction along the first auxiliary grooves and the second auxiliary grooves, wherein
    in the dividing step, a separation region interposed between the first auxiliary grooves connected to the adjacent second auxiliary grooves is divided.

17. The method of manufacturing a semiconductor element according to claim 16, wherein the second auxiliary grooves are deeper then the first auxiliary grooves.

18. The method of manufacturing a semiconductor element according to claim 17, wherein the first auxiliary grooves have a depth locating at a part of the semiconductor element structure and the second auxiliary grooves have a depth reaching the semiconductor substrate.

19. The method of manufacturing a semiconductor element according to claim 17, wherein the second auxiliary grooves are formed by laser processing.

20. A method of manufacturing a semiconductor element comprising:
    a step of forming a first auxiliary groove in a semiconductor element structure provided on a semiconductor substrate;

a step of forming a second auxiliary groove in the semiconductor element structure; and a step of dividing the semiconductor substrate and the semiconductor element structure in a direction along the first auxiliary groove and the second auxiliary groove, wherein the semiconductor element structure is a semiconductor laser element structure, and in the dividing direction, a plurality of the second auxiliary grooves are arranged spaced apart from each other and deeper than the first auxiliary grooves, and at least two first auxiliary grooves are arranged spaced apart from each other between at least a pair of adjacent second auxiliary grooves, and in the dividing step, a resonator surface of the laser element structure is formed by dividing a separation region interposed between the two first auxiliary grooves.

* * * * *